United States Patent
Kozawa et al.

(10) Patent No.: US 7,338,750 B2
(45) Date of Patent: *Mar. 4, 2008

(54) RESIST PATTERN THICKNESS REDUCING MATERIAL, RESIST PATTERN AND PROCESS FOR FORMING THEREOF, AND SEMICONDUCTOR DEVICE AND PROCESS FOR MANUFACTURING THEREOF

(75) Inventors: Miwa Kozawa, Kawasaki (JP); Koji Nozaki, Kawasaki (JP); Takahisa Namiki, Kawasaki (JP); Junichi Kon, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/282,111

(22) Filed: Oct. 29, 2002

(65) Prior Publication Data

US 2003/0143490 A1 Jul. 31, 2003

(30) Foreign Application Priority Data

Jan. 25, 2002 (JP) .............................. 2002-017019

(51) Int. Cl.
*G03F 7/38* (2006.01)
*G03F 7/40* (2006.01)
*G03F 7/30* (2006.01)

(52) U.S. Cl. ...................... 430/314; 430/311; 430/313; 430/315; 430/324; 430/325

(58) Field of Classification Search ................ 430/311, 430/313, 315, 322, 324, 329, 330, 314
See application file for complete search history.

(56) References Cited

U.S. PATENT DOCUMENTS 5,858,620 A * 1/1999 Ishibashi et al. ............ 430/313
6,136,504 A * 10/2000 Tan et al. ................ 430/270.1
6,146,806 A * 11/2000 Maeda et al. ................ 430/170
6,180,320 B1 1/2001 Saito et al.

(Continued)

FOREIGN PATENT DOCUMENTS

EP 1 152 036 A1 * 11/2001

(Continued)

*Primary Examiner*—Richard L. Schilling
(74) *Attorney, Agent, or Firm*—Westerman, Hattori, Daniels & Adrian, LLP.

(57) ABSTRACT

A resist pattern thickness reducing material has at least one type selected from a water soluble resin and an alkali-soluble resin. A process for forming a resist pattern includes a step for coating the resist pattern thickness reducing material such that the surface of a first resist pattern formed is covered and forming a mixing layer of the resist pattern thickness reducing material and the material of the resist pattern, on the surface of the resist pattern. A process for manufacturing a semiconductor device includes a step for forming a resist pattern on an underlayer; a step for coating the resist pattern with a resist pattern thickness reducing material such that the surface of the resist pattern is covered and forming a mixing layer of a material of the resist pattern and the resist pattern thickness reducing material; a step for developing the resist pattern thickness reducing material to reduce thickness of the resist pattern so as to form a resist pattern reduced in thickness; a step for patterning the underlayer by etching by using the resist pattern as a mask.

19 Claims, 3 Drawing Sheets

U.S. PATENT DOCUMENTS

| | | | |
|---|---|---|---|
| 6,579,657 B1* | 6/2003 | Ishibashi et al. | 430/270.1 |
| 2003/0102285 A1* | 6/2003 | Nozaki et al. | 216/41 |
| 2003/0157801 A1* | 8/2003 | Kozawa et al. | 438/689 |
| 2003/0170571 A1* | 9/2003 | Nozaki et al. | 430/314 |
| 2003/0175624 A1* | 9/2003 | Nozaki et al. | 430/296 |
| 2004/0029047 A1* | 2/2004 | Ishibashi et al. | 430/296 |

FOREIGN PATENT DOCUMENTS

| | | |
|---|---|---|
| JP | 5-197151 | 8/1993 |
| JP | 10-73927 | 3/1998 |
| JP | 2000-35672 | 2/2000 |
| JP | 2000-347414 | 12/2000 |
| JP | 2001-33984 | 2/2001 |
| JP | 2001-228616 | 8/2001 |
| JP | 2001-281886 | 10/2001 |
| JP | 2002-49161 | 2/2002 |
| JP | 2002-184673 | 6/2002 |
| JP | 2002-6491 | 9/2002 |
| JP | 2003-131400 | 5/2003 |

* cited by examiner

RESIST PATTERN THICKNESS REDUCING MATERIAL, RESIST PATTERN AND PROCESS FOR FORMING THEREOF, AND SEMICONDUCTOR DEVICE AND PROCESS FOR MANUFACTURING THEREOF

CROSS-REFERENCE TO RELATED APPLICATIONS

This application is based upon and claims priority of Japanese Patent Application No. 2002-017019, filed in Jan. 25, 2002, the contents being incorporated herein by reference.

BACKGROUND OF THE INVENTION

1. Field of the Invention

The present invention relates to a resist pattern formed by reducing thickness of the resist pattern at the time of patterning the resist pattern, an effective process for forming a resist pattern, a resist pattern thickness reducing material capable of forming a resist pattern and reduces thickness of the resist pattern beyond the limit of fineness attainable by a light exposure, and to a semiconductor device and process for manufacturing a semiconductor device utilizing a pattern by the resist pattern.

2. Description of the Related Art

In recent years, as integration further proceeds on semiconductor integrated circuits, LSIs(Large Scale Integrated Circuits) and VLSIs(Very Large Scale Integrated Circuits) have been put into practical use, and accompanying such trend of integration, a technology to form fine-pattern is being sought after. As a technology in forming fine patterns, conventionally, lithography is used. In lithography for instance, a substrate having a thin film thereon is covered with a resist film, the resist film is then selectively exposed and developed to form a resist pattern, followed by dry etching performed utilizing the resist pattern as a mask. Thereafter the resist pattern is removed to obtain a desired wiring pattern.

Here, in order to form fine wiring patterns, wavelength of an exposure light needs to be shortened, and a resist material which exhibits high resolution to the property of the light source of the exposure light needs to be developed. However, in order to shorten the wavelength of the exposure light, there is a need to modify a conventional development apparatus, hence it accompanies a large amount of cost. On the other hand, there is a persistent need to keep using a light exposure (that is, an exposure using a light) to maintain mass production even under fine pattern forming currently under progress.

An object of the present invention is to provide a resist pattern thickness reducing material capable of efficiently forming a resist pattern reduced in thickness which may suitably be used in a resist pattern forming.

Another object of the present invention is to provide a process for forming a resist pattern capable of forming a resist pattern finely formed beyond the limit of fineness attainable by a light exposure, and which may be used with a light source of the conventional light exposure device, and which exceeds in mass producibility.

Still another object of the present invention is to provide a resist pattern which is attainable by reducing thickness of a resist pattern.

Yet another object of the present invention is to provide a high performance semiconductor device which is attainable by utilizing the resist pattern.

And finally, still further object of the present invention is to provide a step for manufacturing a semiconductor device which may be used with a light source of the conventional light exposure device, and which is capable of mass producing a semiconductor device utilizing the resist pattern finely formed beyond the limit of fineness attainable by a light exposure of the light source.

When the resist pattern thickness reducing material is coated onto the resist pattern, portion of the resist pattern thickness reducing material which exists in the vicinity of an interface of the resist pattern impregnates into the resist pattern, thereby forming a mixing layer at an interface. The resist pattern obtained by removing the resist pattern thickness reducing material and the mixing layer, has a fine structure, since the thickness equivalent to the thickness of the mixing layer is removed.

In the process for forming the resist pattern of the present invention, after the resist pattern is formed, the resist pattern thickness reducing material is coated thereon. When the resist pattern thickness reducing material is coated, portion of the resist pattern thickness reducing material which exists in the vicinity of an interface of the resist pattern impregnates into the resist pattern, thereby forming a mixing layer at the surface of the resist pattern. Thereafter, by removing both the resist pattern thickness reducing material and the mixing layer, a finely formed resist pattern reduced in thickness equivalent to the thickness of the removed mixing layer is formed.

Since the resist pattern of the present invention is formed by the process for forming the resist pattern abovementioned, has a fine structure.

Since the semiconductor device of the present invention utilizes the resist pattern, exhibits high quality and high performance.

In the semiconductor manufacturing device of the present invention, after the resist pattern is formed on an underlayer, the resist pattern thickness reducing material is coated thereon. When the resist pattern thickness reducing material is coated, portion of the resist pattern thickness reducing material which exists in the vicinity of an interface of the resist pattern impregnates into the resist pattern, thereby forming a mixing layer at an interface. Thereafter, by removing both the resist pattern thickness reducing material and the mixing layer, a resist pattern having a fine structure reduced in thickness equivalent to the thickness of the removed mixing layer is formed. By using the resist pattern as a mask in performing patterning of the underlayer by etching, the manufacturing of the semiconductor showing high quality and high performance may be achieved.

DESCRIPTION OF THE PREFERRED EMBODIMENTS

Resist Pattern Thickness Reducing Material

Figure 1:
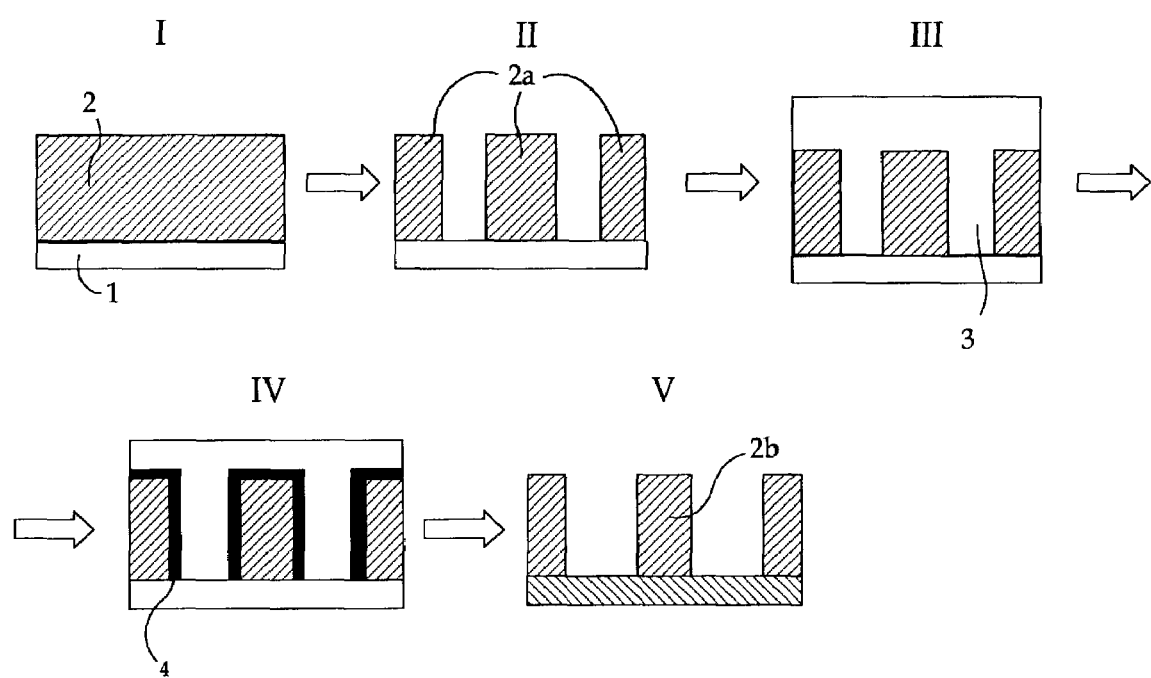
FIG. 1 is a schematic view of one example of the resist pattern thickness reducing material of the present invention showing a thickness reducing mechanism.

The resist pattern thickness reducing material of the present invention comprises at least one type selected from a water-soluble resin and an alkali-soluble resin, and further comprises a cross-linking agent, surface active agent, solvent, and other components as necessary.

An aspect of the resist pattern thickness reducing material of the present invention is not particularly limited, and may be selected according to the object. For instance, aqueous solution, colloidal solution, emulsion solution may be used as the resist pattern thickness reducing material, with preference to aqueous solution.

Water Soluble Resin

The water soluble resin is not particularly limited and may be selected according to the needs, however, the water soluble resin which dissolves 0.1 g or more with respect to 100 g of water is preferred.

The water soluble resin is not particularly limited and may be selected according to the needs. For instance, polyvinyl alcohol, polyvinyl acetal, polyvinyl acetate, polyacryl acid, polyvinyl pyrolidone, polyethylene imine, polyethylene oxide, styrene-maleic acid copolymer, polyvinyl amine, polyarylamine, oxazoline group containing water soluble resin, water soluble melamine resin, water soluble urea resin, alkyd resin, sulfonamide resin and the like may be mentioned as the water soluble resin These water soluble resins may be used alone or in combinations, and may be used in combination with the alkali-soluble resins.

The amount of the water-soluble resin in the resist pattern thickness reducing material may not be uniformly defined when the amount or the types of the cross-linking agent, the surface active agent, and the solvent are considered, and may be suitably selected according to the object.

Alkali-soluble Resin

There is no particular limit for the alkali-soluble resin as long as the resin is soluble in alkaline, and may be selected according to the object. However, alkali-soluble resins which dissolves 0.1 g or more with respect to 100 g of 2.38% tetra methyl ammonium hydroxide (TMAH) under 25° C. is preferred.

There is no particular limit for the alkali-soluble resin, and may be selected according to the object, for instance, those having at least one type as a monomer unit selected from acryl acid, methacrylic acid, itaconic acid, vinyl benzoic acid, vinyl phenol, styrene, polyhydric phenol, polyhydric alcohol, and derivatives thereof is preferred.

Specific examples of the alkali-soluble resin include novolak resin, vinyl phenol resin, polyacryl acid, polymethacrylic acid, poly p-hydroxyphenyl acrylate, poly p-hydroxyphenyl methacrylate, and copolymer resin thereof may be suitably mentioned.

These alkali-soluble resins may be used alone or in combinations of two or more, or may be used together with the water soluble resin.

The amount of the alkali-soluble resin contained in the resist pattern thickness reducing material may be varied according to the amount or the types of the cross-linking agent, the surface active agent, the solvent, and may not be uniformly defined, and may be suitably used according to the object.

Cross-linking Agent

The cross-linking agent is not particularly limited and may be suitably used according to the object, however, those which exhibit cross-linking reaction by heat or acid and soluble to water are preferred, such as amino-type cross-linking agent, melamine derivatives, urea group derivatives, may suitably be used. These may be used alone or in combinations of two or more.

For the amino group cross-linking agents, benzoguanamine, and derivatives thereof may be mentioned.

For the melamine derivatives, alkoxymethylmelamine, and derivatives thereof may be mentioned.

For the urea group derivatives, urea, alkoxymethylene urea, N-alkoxymethylene urea, ethylene urea, ethylene urea carboxylic acid, glycol urea, and derivatives thereof.

The amount of the resist pattern thickness reducing material contained in the cross-linking agent varies according to the amount or the types of the cross-linking agent, alkali-soluble resin, surface active agent, and solvent, and may not be uniformly defined, however, the amount may be suitably defined according to the object.

Surface Active Agent

The surface active agent may suitably be used when affinity between the resist pattern thickness reducing material and the resist pattern onto which the resist pattern thickness reducing material is to be coated is not sufficient. When the surface active agent is contained in the resist pattern thickness reducing material, the mixing layer may be efficiently formed onto the surface of the resist pattern, and may reduce the resist pattern in size, i.e., in thickness and scale, and may effectively suppress foaming of the resist pattern thickness reducing material.

The surface active agent is not particularly limited and for instance, non-ion surface active agent, cation surface active agent, anion surface active agent, amphoteric surface active agent may mentioned, with preference to non-ion surface active agent from the stand point of having a structure which does not contain metal ions. These may be used alone or in combinations of two or more.

The concrete examples of the surface active agents include condensed polyoxyethylene-polyoxypropylene group surface active agents, polyoxyalkylene alkyl ether group surface active agents, polyoxyethylene alkyl ether group surface active agents, polyoxyethylene derivatives group surface active agents, sorbitan aliphatic ester group surface active agents, glycerin aliphatic acid ester group surface active agents, alcohol ethoxylate group surface active agents, phenol ethoxylate group surface active agents.

The amount of the surface active agent contained in the resist pattern thickness reducing material varies according to the amount or types of the water soluble resin, alkali-soluble resin, cross-linking agent, and solvent, and may not be uniformly defined, however, the amount may be suitably defined according to the object.

Solvent

The solvent is not particularly limited, and may be suitably selected according to the object. Examples of the solvent may be water, alcohol group solvent, glycol group solvent, and the like.

The alcohol group solvent may be for instance, methanol, ethanol, propyl alcohol, isopropyl alcohol, butyl alcohol and the like.

The glycol group solvent may be for instance, ethylene glycol, propylene glycol, propylene glycol methyl ether, dipropylene glycol, dimethyl ether and the like.

These solvents may be used alone or in combinations of two or more.

The amount of the solvent contained in the resist pattern thickness reducing material varies according to the amount or types of the water soluble resin, alkali-soluble resin, cross-linking agent, surface active agent and may not be uniformly defined, however, the amount may be suitably defined according to the object.

Other Components

The other components are not limited as long as the effect of the present invention is not adversely affected, and may suitably be selected according to the object. Examples of the other components include known additives such as heat acid generating agent, and quenchers represented by amine group, amide group and ammonium group chlorines.

The amount of the other components contained in the resist pattern thickness reducing material varies according to the amount or the types of water soluble resin, alkali-soluble resin, cross-linking agent, surface active agent, and may not be uniformly defined, however, the amount may be suitably defined according to the object.

Use

The resist pattern thickness reducing material of the present invention may be used by coating onto the resist pattern.

Incidentally, when the resist pattern thickness reducing material does not contain the surface active agent, the surface active agent alone may be separately coated onto the resist pattern before applying the resist pattern thickness reducing material onto the resist pattern.

When the resist pattern thickness reducing material is coated onto the resist pattern, a mixing layer comprising the resist pattern thickness reducing material and the material of the resist pattern is formed. And by removing both the resist pattern thickness reducing material and the mixing layer, a resist pattern reduced in thickness equivalent to the thickness of the removed mixing layer is formed.

In an aspect of the present invention in which the resist pattern thickness reducing material contains a water soluble resin, dissolving speed of a coated film of the resist pattern thickness reducing material with respect to water under 25° C. is preferably 10 Å/s, and more preferably 50 to 1000 Å/s.

Further, in another aspect of the present invention in which the resist pattern thickness reducing material contains a alkali-soluble resin, dissolving speed of a coated film of the resist pattern thickness reducing material with respect to 2.38% tetramethylene ammonium hydroxide solution (TMAH) under 25° C. is preferably 10 Å/s, and more preferably 50 to 1000 Å/s.

Material of the Resist Pattern

The material of the resist pattern is not particularly limited, and may be selected according to the object. The material of the resist pattern may either be a positive type or a negative type.

The step for forming the resist pattern, the size and the thickness of the resist pattern and the like are not particularly limited, and may be selected according to the object. Specifically, the thickness may be determined by considering the substrate (or underlayer) to be processed, condition for etching, and generally defined within the range of 0.3 to 0.7 μm.

The thickness reducing of the resist pattern utilizing the resist pattern thickness reducing material of the present invention will be explained hereinafter with reference to the accompanying drawings.

As shown in step I in FIG. 1, after forming a resist film 2 onto an underlayer (semiconductor substrate 1), resist film 2 is patterned by an exposure light to form a resist pattern 2a, as shown in step II in FIG. 1. For the exposure light, G line beam, I line beam, KrF Excimer Laser, ArF Excimer Laser, F2 Excimer Laser, or charged particle beam may be used, while known exposing apparatus may be used for the exposing method. Thereafter, as shown in step III in FIG. 1, the resist pattern thickness reducing material 3 is coated onto the surface of the resist pattern 2a, and then pre-baked (heating and drying) to form a coating film. Consequently, as shown in step IV in FIG. 1, mixing (impregnation) of the resist pattern thickness reducing material 3 with the resist pattern 2a occurs at the interface of the resist pattern thickness reducing material and the resist pattern, a mixing layer 4 is formed at the surface of the resist pattern 2a. At this time, baking with higher temperature than the pre-baking (heating and drying) may be performed. Further, as shown in step V in FIG. 1, by developing, the mixing layer 4 in the resist pattern 2a and the coated resist pattern thickness reducing material 3, hence a portion having high water solubility to high alkali solubility are dissolvedly removed and forms (develops) a resist pattern 2b (thickness reduced resist pattern).

Here, the dissolving speed of the mixing layer 4 at the time of dissolving depends on water solubility or alkali solubility of the resist pattern thickness reducing material. Moreover, the development may be a development by water or a weak alkali solution.

Application

The resist pattern thickness reducing material of the present invention may further be used to reduce thickness of a resist pattern, and may suitably be used to the resist pattern of the present invention and the manufacturing method thereof, the semiconductor device of the present invention and the manufacturing method thereof.

Resist Pattern and Resist Pattern Forming Method

The resist pattern of the present invention may be formed by the process for forming the resist pattern of the present invention.

In the process for forming the resist pattern of the present invention, after forming a first resist pattern, the resist pattern thickness reducing material of the present invention is coated onto the surface of the first resist pattern. The step for forming the resist pattern includes forming the mixing layer onto the surface of the first resist pattern comprising the material of the first resist pattern and the resist pattern thickness reducing material, and further, an application suitably selected, such as developing.

For the material of the resist pattern, those abovementioned in the resist pattern thickness reducing material may preferably be mentioned.

The resist pattern, for instance, may be formed according to the known method in which the resist film formed onto the underlayer (substrate) is patterned.

The underlayer (substrate) is not limited, and may be selected according to the object, however, when the resist pattern is to be formed on the semiconductor device, the underlayer (substrate) may be a silicone wafer or the like.

The step for coating the resist pattern thickness reducing material is not limited, and may suitably be selected according to the object, for instance, spin-coating method may be mentioned. When adopting the spin-coating method, a preferable condition be 100 to 10,000 rpm, and more preferably be 800 to 5,000 rpm, with operation time of 1 second to 10 minute, more preferably 1 second to 60 seconds.

At the time of coating, the surface active agent may be excluded from the resist pattern thickness reducing material, and instead, may be separately coated onto the first resist pattern before coating the resist pattern thickness reducing material.

Pre-baking (heating and drying) the resist pattern thickness reducing material at the time of coating or after the coating is preferred from the standpoint of efficiently forming a mixture (impregnation) of the resist pattern thickness reducing material with the first resist pattern on the interface of the first resist pattern and the resist pattern thickness reducing material.

The condition and the method for pre-baking (heating and drying) are not particularly limited, and may be selected according to the object. For instance, temperature in the range of 40 to 150° C. is preferred, and more preferably, 70 to 120° C., while 10 second to 5 minutes is preferred for the pre-baking time, and more preferably 30 seconds to 120 seconds.

Alternatively, the resist pattern thickness reducing material may be baked after pre-baking (heating and drying) of the resist pattern thickness reducing material which is being coated.

The condition or the method for baking are not particularly limited, and may be selected according to the object. However, the baking is generally conducted under higher temperature than the pre-baking (heating and drying). As to the condition of the baking, for example, temperature in the range of 70 to 160° C. is preferred, and more preferably, 90 to 130° C., while baking time of 10 seconds to 5 minutes is preferred, and more preferably 30 seconds to 120 seconds.

Further, the developing of the resist pattern thickness reducing material is preferably conducted after the baking. It is preferable in that, by developing, the resist pattern thickness reducing material and the mixing layer, hence the water soluble to alkali soluble portions are efficiently dissolved and removed, the resist pattern reduced in thickness is obtained. The process for developing is as described above.

Here, the process for forming the resist pattern of the present invention is described hereinafter with reference to the accompanying figures.

As shown in step I in FIG. 1, after the resist film 2 is formed onto the underlayer (semiconductor substrate 1), the resist film is patterned, and as shown in step II in FIG. 1, the first resist pattern 2a is formed. Thereafter, as shown in step III in FIG. 1, the resist pattern thickness reducing material 3 (pattern size reducing material) is coated onto the surface of the first resist pattern 2a, and pre-baked (heating and drying) to form a coating layer. Consequently, as shown in step IV in FIG. 1, a mixing (impregnation) of the resist pattern thickness reducing material to the first resist pattern 2a occurs on the interface of the first resist pattern 2a and the resist pattern thickness reducing material 3, and forms a mixing layer 4 at the surface of the first resist pattern 2a. Here, baking under higher temperature than the pre-baking (heating and drying) may be conducted.

Thereafter, as shown in step V in FIG. 1, by carrying out developing, the resist pattern thickness reducing material 3 and the mixing layer 4 in the first resist pattern 2a, hence the portions exhibiting high water solubility is dissolvedly removed, and a thickness reduced resist pattern 2b (or a size reduced resist pattern) is formed (developed).

The developing may be a development by water or by a weak alkali solution.

The resist pattern formed by the process for forming the resist pattern of the present invention has a fine structure since the thickness equivalent to the mixing layer is removed. The process for forming the resist pattern of the present invention may obtain a resist pattern finely formed.

The resist pattern of the present invention formed by the process for forming the resist pattern of the present invention may suitably be used for example, in functional parts such as a mask pattern, a reticle pattern, a magnetic head, a LCD (Liquid Crystal Display), a PDP (Plasma Display Panel), a SAW (Surface Acoustic Wave) filter, in optical parts used for connection in an optical wirings, micro parts such as micro actuators, and semiconductor device, and suitably be uses in the semiconductor device of the present invention.

Semiconductor Device and a Process for Manufacturing the Semiconductor Device

The semiconductor device of the present invention is not particularly limited as long as the resist pattern of the present invention is utilized, and any known member suitably selected according to the object may be adopted.

Concrete examples of the semiconductor device of the present invention include Flash Memories, DRAMs, FRAMs, and MOS Transistors.

The semiconductor device of the present invention may be manufactured according to the process for manufacturing the semiconductor device of the present invention described hereinafter.

The process for manufacturing the semiconductor device of the present invention comprises a step for forming a resist pattern, and a step for patterning, and further other processes suitably selected as necessary.

The step for forming the resist pattern is a step for forming the resist pattern onto the underlayer, coating the resist pattern thickness reducing material onto the surface of the resist pattern, forming on the surface of the resist pattern, the mixing layer comprising the material of the resist pattern and the resist pattern thickness reducing material, and developing the resist pattern to form the resist pattern reduced in thickness.

For the underlayer, surface layer of various members adopted in the semiconductor device may be mentioned, with preference to the substrates such as silicone wafers and the like or surface layers thereof may be mentioned. The resist pattern and the step for coating are as above described. Further, pre-baking and the baking are preferably performed after the coating.

The step for patterning is a step for patterning the underlayer by etching the resist pattern formed in the step for forming the resist pattern as a mask.

The process for etching is not particularly limited and may be suitably selected according to the object from the known methods, however, dry etching preferably may be mentioned. The condition of etching is not particularly limited and may be suitably selected according to the object.

The other processes preferably include for example, a step for coating surface active agents, and a step for developing.

The step for coating surface active agent is a step for coating on the surface of the resist pattern, the surface active agent in advance to the step for forming the resist pattern.

The surface active agent, as earlier mentioned is preferably a nonionic surface active agent, and preferably at least one type selected from a group comprising: condensed polyoxyethylene-polyoxypropylene compound, polyoxyalkylene alkyl ether compound, polyoxyethylenealkylether compound, polyoxyethylene derivative compound, sorbitan aliphatic acid ester compound, glycerin aliphatic acid ester compound, primary alcohol ethoxylate compound, and phenol ethoxylate compound.

The developing step is a step for developing the coated resist pattern thickness reducing material after the step for forming the resist pattern and before the step for patterning.

Using the process for manufacturing the semiconductor of the present invention, various semiconductor device such as Flash Memories, DRAMs, FRAMs, and MOS Transistors and the like may be efficiently manufactured.

Now, the embodiments of the present invention will be concretely described hereinafter, however, the present invention should not be construed to be limit solely by the these embodiments.

Embodiment 1

Preparation of the Resist Pattern Thickness Reducing Material

The thickness reducing materials A to H of the present invention having compositions shown in Table 1 were prepared. Unit values in parenthesis denote parts by mass. "KW-3" found under column "Resin" denotes polyvinylacetal resin (manufacturer: SEKISUI CHEMICAL CO., LTD.), "PVA" denotes polyvinyl alcohol resin (manufacturer: KURARE CO., LTD. Trade Name—Poval 117), "PVP" denotes polyvinyl phenol resin (manufacturer: MARUZEN CHEMICALS CO., LTD). "Uril" under "cross-linking agent" denotes tetramethoxymethylglycol uril, "Uria" denotes N, N'-dimethoxymethyldimethoxyethyleneuria, "melamine" denotes hexamethoxymethylmelamine. "TN-80" under column "Surface active agent" denotes nonionic surface active agent (manufacturer: ASAHI DENKA KOGYO/Trade Name: polyoxyethylene monoalkylether group surface active agent), "PC-8" denotes nonionic surface active agent (ASAHI DENKA KOGYO/ Trade Name: Phenolethoxylate group surface active agent). Pure water (deionized water), isopropyl alcohol (IPA), ethylene glycol (EG), Propylene glycol methyl ether (PGME) are respectively used as the water soluble resin, and/or the alkali-soluble resin, the cross-linking agent, and the solvent excluding the surface active agent.

TABLE 1

| | Resin | Cross-linking Agent | Surface Active Agent | Solvent |
|---|---|---|---|---|
| A | KW-3(10) PVA(2) | none | none | Water (90) |
| B | KW-3(10) | none | PC-8 (0.6) | Water (89.5)/IPA (0.5) |
| C | KW-3(10) | Uril (1.3) | TN-80 (0.25) | Water (89.5)/IPA (0.5) |
| D | KW-3(2) PVP(8) | Uria (1) | none | EG (58.5)/PGME (31.5) |
| E | PVP(8) | Uria (2) | none | EG (58.5)/PGME (31.5) |
| F | PVP(8) | Uria (1) | TN-80 (0.25) | EG (58.5)/PGME (31.5) |
| G | PVP(10) | none | none | EG (58.5)/PGME (31.5) |
| H | PVP(10) | none | TN-80 (0.25) | EG (58.5)/PGME (31.5) |

-Resist Pattern and Forming of the Resist Pattern-

On an isolated line pattern formed by the ArF Resist (SUMITOMO CHEMICAL CO., LTD. Trade Name: PAR700), the resist pattern thickness reducing material A to H of the present invention prepared by the above prescription was coated by the spin coating method initially under condition of 1000 rpm/5 s, and then, 3500 rpm/40 s, the pre-baking was performed under 85° C./70 s, thereafter baking was performed under 110° C./70 s, and the resist pattern thickness reducing material A to H were rinsed 60 seconds by pure water or alkali developer, the resist pattern thickness reducing material and the mixing layer were both removed and formed resist patterns reduced in thickness by the resist pattern thickness reducing material A to H.

The sizes of the resulting resist patterns with the corresponding sizes of initial resist patterns are shown in Table 2. In Table 2, "A" to "H" corresponds to resist pattern thickness reducing materials A to H.

TABLE 2

| | Initial thickness of the resist pattern (nm) | Size of the thickness reduced resist pattern (nm) |
|---|---|---|
| A | 200.8 | 195.1 |
| B | 203.6 | 197.5 |
| C | 203.3 | 184.3 |
| D | 201.4 | 188.6 |
| E | 203.3 | 178.8 |
| F | 202.5 | 174.3 |
| G | 200.8 | 194.1 |
| H | 202.1 | 190.0 |

From the result shown in Table 2, the resist pattern thickness reducing material of the present invention is capable of reducing the thickness of the resist pattern.

Next, on the surfaces of the resists formed on the silicone substrates (underlayers), the resist pattern thickness reducing materials C and F are coated and cross-linked to form surface layers having thicknesses of 0.5 μm. Thereafter, etching was performed for three minutes under conditions p μ=200W, pressure=0.02 Torr, $CF_4$ Gas=100 sccm using an etching device (parallel-plate RIE Device, manufactured by FUJITSU LIMITED) against these surface layers and the KrF resists (manufacturer: Shipley Company L.L. C. Trade Name: UV-6) and polymethyl methacrylate (PMMA) both for purpose of evaluation. Thereafter, reduced amount of the film were measured, etching rate were calculated, and comparative evaluation was performed using etching rate of the KrF resist as the standard.

TABLE 3

| Name of Material | Etching rate (Å/min) | Ratio against Standard |
|---|---|---|
| UV-6 | 627 | 1.00 |
| PMMA | 770 | 1.23 |
| C | 640 | 1.02 |
| F | 615 | 0.98 |

From the results shown in Table 3, an etching resistance of the resist pattern thickness reducing material of the present invention is closer to etching resistance of the KrF resist, and apparently superior to etching resistance of the PMMA.

Embodiment 2

Manufacturing of MOS Transistor

Figure 2:
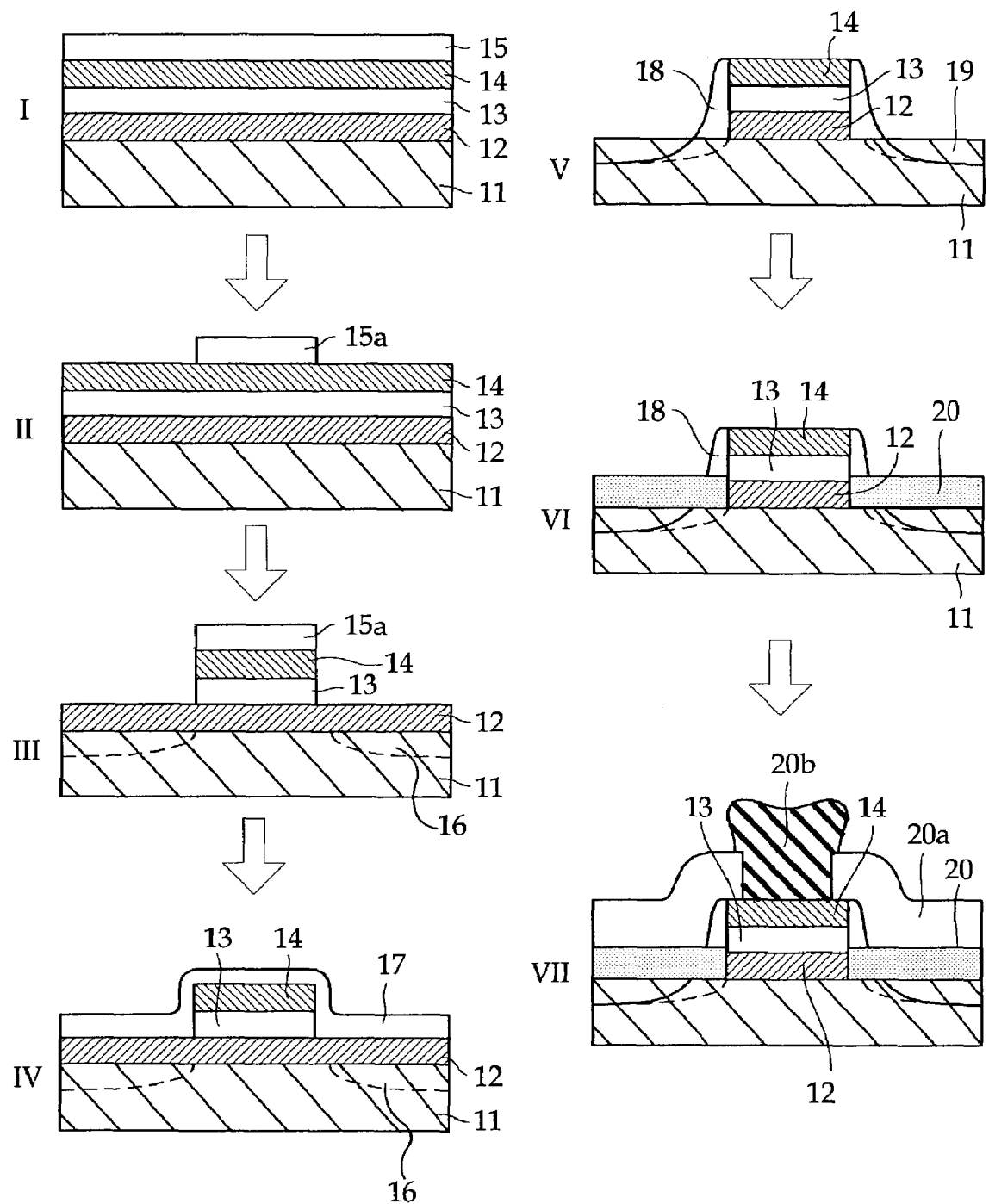
FIG. 2 is a process diagram showing one example of the manufacturing of a MOS transistor which is a semiconductor device applying the resist pattern thickness reducing material of the present invention.

As shown in process I in FIG. 2, on a surface of the silicone substrate (or underlayer) 11, gate oxide film 12 is formed on which a polysilicone film (Poly-Si film) 13 is formed by CVD method. Thereafter n type impurities such as phosphorus and the like are injected to drop resistance. Then, WSi film 14 was formed using sputtering method (alternatively CVD method may also be applied). Next, as shown in step II in FIG. 2, in order to pattern the Poly-Si film 13 and the WSi film 14, the resist film 15 is formed on the WSi film 14 formed in the previous step and patterned to obtain the resist pattern 15a. Using the resist pattern 15a as a mask, anisotropic etching was performed, the WSi film 14 and the Poly-Si film 13 were orderly etched to form a gate electrode comprising the Poly-Si film 13 and the WSi film 14. Thereafter, phosphorus was injected by ion injection to form N-diffused layer 16 constituting LDD structure. After forming the pattern as shown in step III in FIG. 2, the resist pattern 15a was peeledly removed. After the formation of the gate electrode, oxidation film 17 was formed on the entire surface using CVD method as shown in step IV in FIG. 2. Then, as shown in step V in FIG. 2, oxidation film 17 was applied with anisotropic etching, and formed a sidewall 18 at the side of the gate electrode comprising the Poly-Si film 13 and the WSi film 14. Next, as shown in step VI in FIG. 2, using the sidewall 18 and the WSi film 14 as mask, ion injection was performed, $N^+$ diffusion layer 19 was formed, and in order to activate the $N^+$ diffusion layer 19, heat treatment was conducted in the nitrogen atmosphere, followed by heating in the oxygen atmosphere. Consequently, the gate electrode was covered with heat oxidation film 20. Continuously, as shown in step VII in FIG. 2, an interlayer insulation film 20a was formed using CVD method, patterned after forming the resist film thereon, and obtained the resist pattern. Using this resist pattern as mask, anisotropic etching was performed a contact hole was opened in the interlayer insulation film 20a. An aluminum wiring 20b was formed in the contact hole, and obtained a fine N-Channel MOS Transistor.

Regarding an embodiment 2, a resist pattern 15a is formed by using the same method applied in the embodiment 1, reduced in thickness using the resist pattern thickness reducing material of the present invention Embodiment 3

Manufacturing of Thin Layer Magnetic Head

Figure 3:
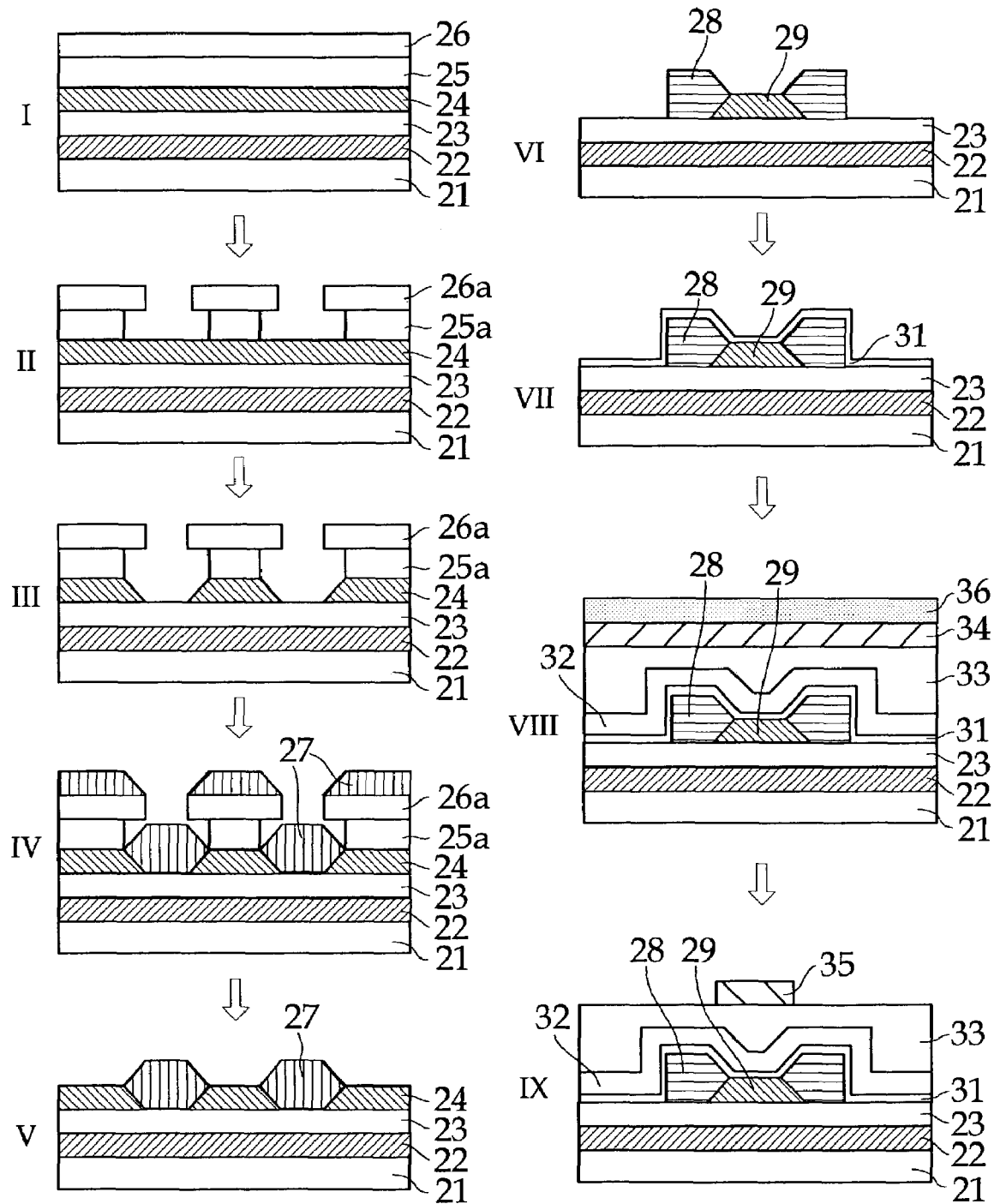
FIG. 3 is a process diagram showing one example of manufacturing a thin film magnetic head applying the resist pattern thickness reducing material of the present invention.

As shown in step 1 in FIG. 3, on the AlTic substrate 21, a shield film 22 comprising FeN, and a gap layer 23 comprising silicone oxidation film are successively formed in order, and a magneto resistance effect film 24 comprising FeNi is formed thereon using sputtering method. On the magneto resistance effect film 24, a general purpose PMGI resist film 25 (Manufactured by US MICROLITHOGRAPHY CHEMICAL CO.) was formed, a resist film 26 was additionally formed thereon, patterned to obtain a resist pattern 26a. Concurrent with the formation of the resist pattern 26a, PMGI resist film 25 was isotropic developed, and as shown in step II in FIG. 3, a pattern 25a having the profile of undercut was formed. Thereafter, as shown in step III in FIG. 3, ion-milling was performed using the pattern 25a as a mask, magneto resistance effect film 24 was performed etching in a shape of taper. Thereafter, as shown in step IV in FIG. 3, a TiW film 27 was formed using the sputtering method on the entire surface of the processed layer. Next, when the pattern 25a, the resist pattern 26a and the TiW film 27 were removed using a lift off method, the TiW film 27 was exposed as shown in step V in FIG. 3. Further, similarly to the method abovementioned, after magneto resistance effect film 24 and the TiW film 27 were patterned (not shown in the drawings), an electrode 28 and a MR element 29 were formed as shown in step VI in FIG. 3. Then, as shown in step VII in FIG. 3, a gap insulation layer 31 comprising the $SiO_2$ film was formed on the entire surface of the processed layer. Next, as shown in step VIII in FIG. 3, after forming the gap insulation layer 31, a sealed film comprising FeNi film, and a gap layer 33 comprising $Al_2O_3$ were formed in the order of sequence, and further, FeNi layer 34 was formed thereon. Then, a resist film 36 was formed on the entire surface of the FeNi film 34, patterned, and a resist pattern having an opening in the portion of light electrode was formed. Using this resist pattern as a mask, the FeNi film was isotropic etched, and formed a thin layer magnetic head 35 provided with a light electrode 35 as shown in step IX in FIG. 3.

Regarding an embodiment 3, a resist pattern 26a is formed by using the same method applied in the embodiment 1, reduced in thickness using the resist pattern thickness reducing material of the present invention.

According to the present invention, a resist pattern thickness reducing material capable of reducing thickness of the resist pattern which may be used in the formation of the resist pattern may be provided.

Moreover, the present invention provides a process for forming a resist pattern utilizing a light source of the conventional exposure device, and which may form a resist pattern finely formed beyond the limit of fineness attainable by the light exposure, and exceeds in mass producibility.

Further, the present invention provides a resist pattern finely formed by reducing the thickness of the resist pattern.

Still further, the present invention provides a high performance semiconductor device utilizing a resist pattern finely formed.

Yet further, the present invention provides a process for forming a semiconductor device capable of mass producing with high efficiency, a semiconductor device which utilizes a resist pattern finely formed beyond the limit of fineness attainable using the light exposure with the light source of the conventional light exposure device.

What is claimed is:

1. A process for forming a resist pattern comprising:
    a step for forming a first resist pattern;
    a step for coating a surface of the first resist pattern with a resist pattern thickness reducing material so that a portion of the resist pattern thickness reducing material which exists in the vicinity of an interface of the first resist pattern impregnates the first resist pattern; and
    a step of removing the impregnated surface of the first resist pattern,
    wherein the resist pattern thickness reducing material comprises a water-soluble resin and a surface active agent,
    wherein the surface active agent is at least one selected from the group consisting of polyoxyethylene alkyl ether group surface active agent, and phenol ethoxylate group surface active agent,
    wherein the resist pattern thickness reducing material is capable of reducing the thickness of an ArF resist.

2. A process for forming a resist pattern according to claim 1, wherein the step for removing utilizes at least one of water and an alkali developer.

3. A process for manufacturing a semiconductor device, comprising:
    a step for forming a resist pattern on an underlayer;
    a step for coating a surface of the resist pattern with a resist pattern thickness reducing material so that a portion of the resist pattern thickness reducing material which exists in the vicinity of an interface of the first resist pattern impregnates the first resist pattern; and
    a step for removing the impregnated surface of the resist pattern and
    a step for patterning the underlayer by etching by using the resist pattern as a mask;
    wherein the resist pattern thickness reducing material comprises a water-soluble resin and a surface active agent,
    wherein the surface active agent is at least one selected from the group consisting of polyoxyethylene alkyl ether group surface active agent, and phenol ethoxylate group surface active agent,
    wherein the resist pattern thickness reducing material is capable of reducing the thickness of an ArF resist.

4. A process for forming a resist pattern according to claim 1, wherein a coated film of the resist pattern thickness reducing material exhibits a dissolving speed of 10 Å/s or more with respect to a water under 25° C.

5. A process for forming a resist pattern according to claim 1, wherein the resist pattern thickness reducing material exhibits a water solubility of 0.1 g or more with respect to 100 g of water under 25° C.

6. A process for forming a resist pattern according to claim 1, wherein the water-soluble resin is a type selected from a group comprising polyvinyl alcohol, polyvinyl acetal, polyvinyl acetate, polyvinyl pyrolidone, polyethylene imine, polyethylene oxide, polyacrylic acid, polyvinyl amine, and polyacryl amide.

7. A process for forming a resist pattern according to claim 1, wherein the resist pattern thickness reducing material further comprises a cross-linking agent.

8. A process for forming a resist pattern according to claim 7, wherein the cross-linking agent is a type selected from a group comprising amino-type cross-linking agents, melamine derivatives, and urea group derivatives.

9. A process for forming a resist pattern according to claim 1, wherein the resist pattern thickness reducing material further comprises a solvent.

10. A process for forming a resist pattern according to claim 9, wherein the solvent is a type selected from a group comprising water, alcohol group solvent, and glycol group solvent.

11. A process for forming a resist pattern according to claim 1, wherein the content of the surface active agent is 0.25 parts by weight in 100.25 parts by weight of the resist pattern thickness reducing material.

12. A process for manufacturing a semiconductor device according to claim 3, wherein a coated film of the resist pattern thickness reducing material exhibits a dissolving speed of 10 Å/s or more with respect to a water under 25° C.

13. A process for manufacturing a semiconductor device according to claim 3, wherein the resist pattern thickness reducing material exhibits a water solubility of 0.1 g or more with respect to 100 g of water under 25° C.

14. A process for manufacturing a semiconductor device according to claim 3, wherein the water-soluble resin is a type selected from a group comprising polyvinyl alcohol, polyvinyl acetal, polyvinyl acetate, polyvinyl pyrolidone, polyethylene imine, polyethylene oxide, polyacrylic acid, polyvinyl amine, and polyacryl amide.

15. A process for manufacturing a semiconductor device according to claim 3, wherein the resist pattern thickness reducing material further comprises a cross-linking agent.

16. A process for manufacturing a semiconductor device according to claim 15, wherein the cross-linking agent is a type selected from a group comprising amino-type cross-linking agents, melamine derivatives, and urea group derivatives.

17. A process for manufacturing a semiconductor device according to claim 3, wherein the resist pattern thickness reducing material further comprises a solvent.

18. A process for manufacturing a semiconductor device according to claim 17, wherein the solvent is a type selected from a group comprising water, alcohol group solvent, and glycol group solvent.

19. A process for manufacturing a semiconductor device according to claim 3, wherein the content of the surface active agent is 0.25 parts by weight in 100.25 parts by weight of the resist pattern thickness reducing material.

* * * * *